United States Patent [19]

Kuze

[11] Patent Number: 4,675,513

[45] Date of Patent: Jun. 23, 1987

[54] EPROM PROGRAMMER

[76] Inventor: Yoshikazu Kuze, 31-3, Higashimagome 1-chome, Ohta-ku, Tokyo, Japan

[21] Appl. No.: 686,905

[22] Filed: Dec. 27, 1984

[30] Foreign Application Priority Data

Dec. 28, 1983 [JP] Japan .............................. 58-245072

[51] Int. Cl.$^4$ ............................................. G06F 15/20
[52] U.S. Cl. .................................. 235/375; 235/454; 235/474; 365/201
[58] Field of Search ............... 235/454, 375, 380, 474; 365/201; 377/46

[56] References Cited

U.S. PATENT DOCUMENTS

| 4,363,960 | 12/1982 | Kuze | 235/454 |
| 4,442,345 | 4/1984 | Mollier et al. | 235/375 X |
| 4,456,967 | 6/1984 | Kuze | 364/900 |

Primary Examiner—David L. Trafton

Attorney, Agent, or Firm—Birch, Stewart, Kolasch & Birch

[57] ABSTRACT

When supply voltage is first supplied to an EPROM programmer, the system is placed in an erase check mode. An EPROM is attached to the device, and an erase check switch is depressed. If there is no abnormality in the EPROM, a ring counter operates to change the system to a write mode. A program sheet is inserted into the device from one side up to a predetermined position and taken out from the other side. After that, writing data into a RAM, programming of the EPROM dependent on the data in the RAM, and verify checking of the programmed EPROM are sequentially operated automatically by output signals from the ring counter. If an abnormality is detected in the erase check mode or verify check mode, the abnormality is indicated and the ring counter is reset to return the initial state. Thus, the EPROM can be replaced for re-programming operation.

3 Claims, 7 Drawing Figures

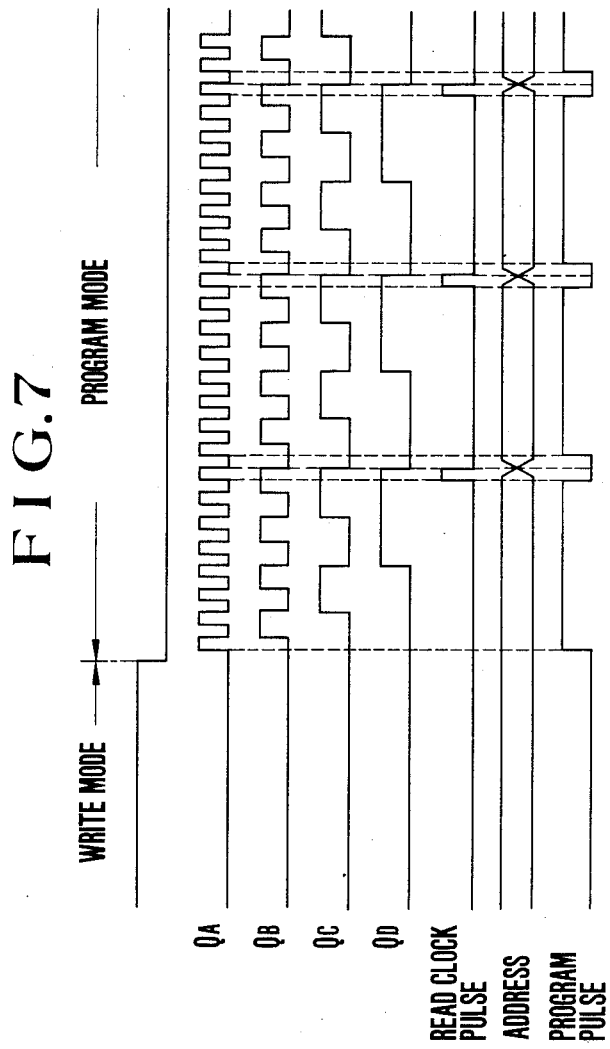

EPROM PROGRAMMER

BACKGROUND OF THE INVENTION

The present invention relates to an EPROM programmer for writing data in an EPROM, and more particularly to an EPROM programmer provided with a ring counter for sequentially changing the operating mode of the programmer in such an order as an erase check mode, write mode, program mode, verify check mode, and reset mode.

SUMMARY OF THE INVENTION

An object of the present invention is to provide an EPROM programmer which automatically checks an EPROM before writing and after writing therein by sequentially changing the operating mode.

Another object of the present invention is to provide an EPROM programmer employed with a photoelectric or magnetic type sheet reader as data input means.

According to the present invention, a data input means comprises, a well-known sheet reader of a photoelectric type or a magnetic type. In the photoelectric type, a transparent program sheet is employed, and a time chart is formed on the transparent program sheet by adhesive opaque tapes. In the magnetic type, a non-magnetic program sheet is employed and magnetic tapes are attached on the sheet. When supply voltage is supplied to the programmer, the system operates in an erase check mode. An EPROM is attached to the device, and an erase check switch is depressed. If there is no abnormality in the EPROM, a ring counter operates to change the system to a write mode. The program sheet is inserted into the device from one side up to a predetermined position and immediately taken out from the other side. After that, writing data into a RAM, programming of the EPROM dependent on the data in the RAM, and verification checking of the programmed EPROM are sequentially operated in dependence on output signals from the ring counter. Finally, the program is completed by a self-reset of the ring counter.

If an abnormality is detected in the erase check mode or verify check mode, both an abnormality indicating lamp and a finish indicating lamp are lighted. The ring counter is reset to return the initial state. Thus, the EPROM is replaced for re-programming operation.

According to the present invention, the programming of EPROM can be easily and rapidly done and has a high reliability by virtue of the erase and verify checking.

These and other objects and features of the present invention will become more apparent from the following description with reference to the accompanying drawings.

BRIEF DESCRIPTION OF THE DRAWINGS

FIG. 7 is a timing diagram of program pulses.

DESCRIPTION OF THE PREFERRED EMBODIMENTS

Figure 1:
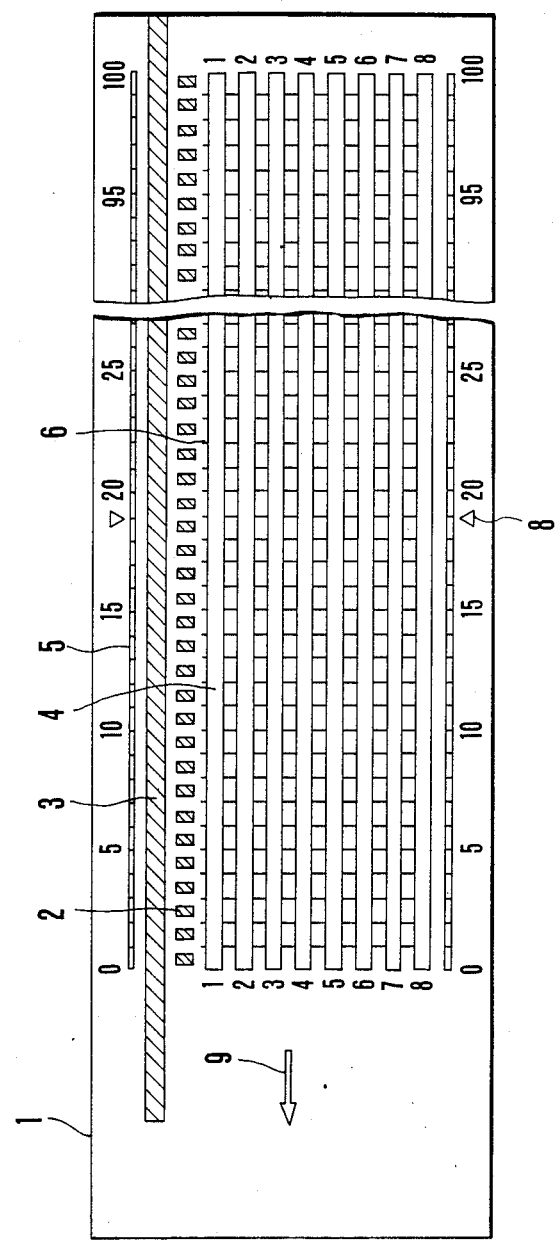
FIG. 1 shows a transparent program sheet for an EPROM programmer according to the present invention.

Referring to FIG. 1, numeral 1 is a transparent sheet, 2 is a plurality of write timing clock marks and 3 is an R/W line for generating signals for writing and reading which are printed by opaque ink. 4 designates a plurality of parallel data lines and 5 is a scale having one hundred indications. A plurality of indications 6 corresponding to the scale 5 are provided. As hereinafter described, the write timing clock marks 2 are used for write clock pulses, the R/W line 3 is used for changing the write to the read of data, the data line 4 forms a time chart with adhesive opaque tapes.

Each indication 6 is in a central position between write clock marks 2, which prevents any erroneous counting of data pulses. 8 is an index for positioning the sheet in a device body and 9 is an arrow showing an insertion direction of the sheet.

Figure 2:
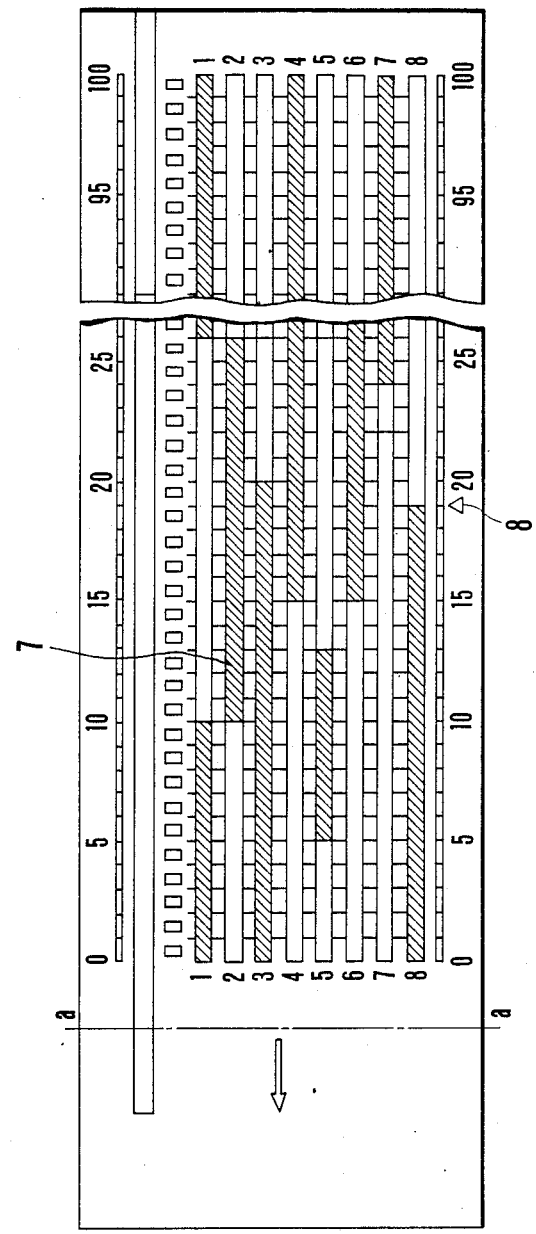
FIG. 2 shows a transparent program sheet on which a time chart is attached to an opaque tape.

FIG. 2 shows a sheet in which eight step time charts are provided by adhesive opaque tapes. A dotted line a—a is an operational start line when the sheet is inserted into a sheet reader device as described hereinafter.

For a programmer using a magnetic sheet, a program sheet is made of non-magnetic material. The timing clock marks and R/W lines are printed in magnetic ink and data lines are formed with adhesive magnetic tapes.

The magnetic sheet type EPROM programmer operates with a sheet reader using well known hole elements. Other structures such as circuits for writing data and an appearance of the device of the magnetic sheet type EPROM programmer are the same as the photoelectric sheet type EPROom programmer which is hereinafter explained.

Figure 3:
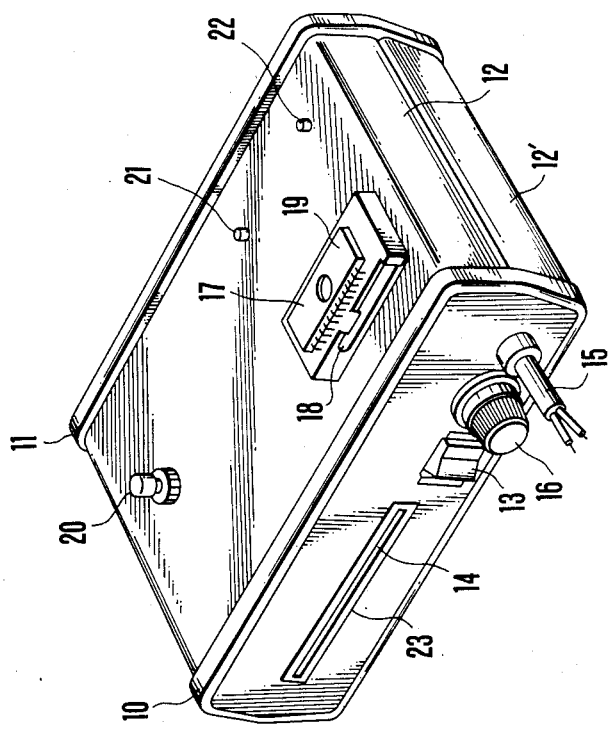
FIG. 3 is a perspective view of an EPROM programmer.

FIG. 3 is a perspective view of the programmer of the present invention. A case comprises panel plates 10 and 11 and a pair of covers 12, 12' made of metal plate. Numeral 13 is a power switch, 14 is a program sheet extracting slot provided in a sheet reader 23, 15 is a supply cord, and 16 is a fuse. An EPROM 17 is detachably fixed to the connector 19 by a lock lever 18. Numeral 20 designates an erase check switch, 21 is a finish indicating lamp, and 22 is an abnormality indicating lamp.

Figure 4:
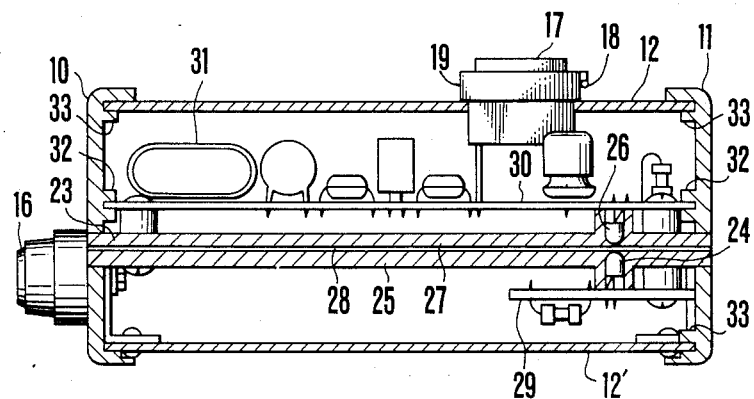
FIG. 4 shows a transverse cross-sectional view of the programmer.

As shown in FIG. 4, the programmer comprises a light emitting panel 25 having a plurality of light emitting elements 24 and a light receiving panel 27 having a plurality of light receiving elements 26 and both panels are engaged with a sliding inserting engagement so as to be facing each other and supported by grooves provided in panels 10, 11 to form a slot 28 for passing the program sheet. A printed wiring board 29 is secured to the light emitting panel 25. Secured to the light receiving panel 27, is a printed wiring board 30 on which memories, gates, a crystal oscillator 31, capacitors, resistors and the EPROM 17 having connector 19 are provided.

As shown in FIG. 4, a pair of supporting projections 32 for the board 30 and projections 33 for covers 12, 12' are formed in panels 10 and 11.

Figure 5:
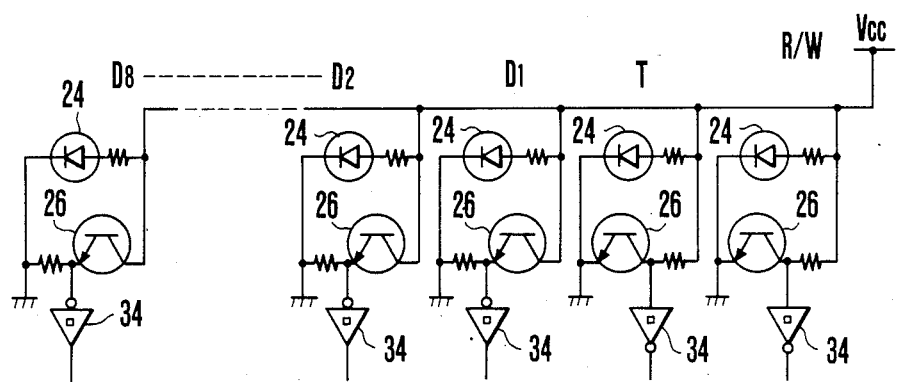
FIG. 5 shows a circuit of a photo-electric switching array of a sheet reader.

Referring to FIG. 5, the photo-electric switch array comprises a photoelectric switch unit R/W corresponding to the R/W line 3 in FIG. 1, photoelectric switch unit T corresponding to the write clock mark 2 and eight photoelectric switch units D1, D2 . . . D8 corresponding to data lines. Output of each photoelectric switch unit is shaped by a Schmitt trigger 34. A photo-transistor 26 of each of the photoelectric switch units R/W and T is turned off when the light from the light emitting diode 24 to the photo-transistor 26 is interrupted by the opaque portion of the program sheet 1, so that the output of the circuit goes to a "1" and the output of the Schmitt trigger 34 goes to a "0". The photo-transistor 26 opposite the transparent portion of the sheet is turned on, so that the output of the Schmitt trigger 34 becomes a "1".

Each of the photo-transistors of photo-electric switch units D1, D2 . . . D8 is of the emitter follower type. Accordingly, the output of the Schmitt trigger 34 opposite the opaque portion is "1" and output corresponding to transparent portion is "0".

Figure 6:
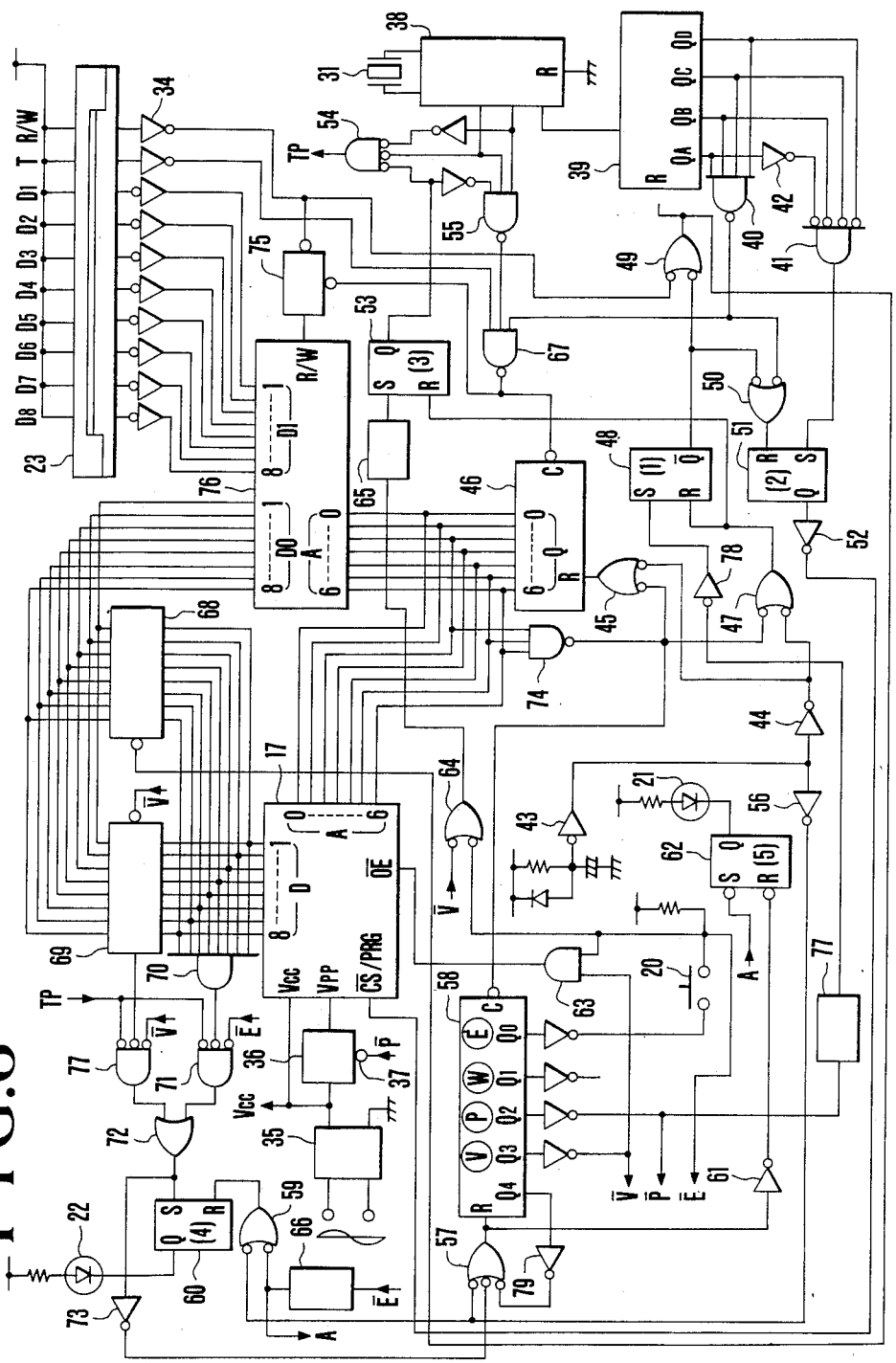
FIG. 6 shows a circuit of the present invention.

FIG. 6 shows a circuit of the system in which data are written in the EPROM 17, operated by a single power source of +5 volt. The system power source $V_{CC}$ is obtained by an AC/DC converter 35, and +25 volt supplied to $V_{PP}$ of the EPROM 17 is obtained by a DC/DC converter 36 by stepping up the $V_{CC}$. When the input 37 of the convertor 36 is "0", voltage of +25 volt is supplied to the $V_{PP}$ terminal, when the input is "1", the supply is stopped.

To the EPROM 17, N-bit program pulses are applied at every addressing and the program is written in upon one loop. At that time, the width of the program pulses applied to the terminal CS/PRG is about 50 ms per one address.

Frequency of the crystal oscillator 31 is decided so as to obtain a program pulse of 50 ms. The frequency is divided by a first frequency divider 38 and a second frequency divider 39, divider outputs QA, QB, QC, and QD of the divider 39 are applied to a 4-input NAND gate 40. In the erase check mode, write mode, and verify mode, the divider outputs are stopped, and in the program mode, pulses are generated from the outputs QA, QB, QC, and QD. As shown in FIG. 7, a read clock pulse is generated from the 4-input NAND gate 40 at every eight counts of QA.

Also, divider outputs QA, QB, QC and QD are applied to a 4-input NAND gate 41. The QA terminal is connected to the gate 41 through an inverter 42.

When divider outputs QA, QB, QC and QD are 1,0,0,0, the gate 41 produces an output for setting a flip-flop 51. The output Q of the flip-flop 51 is applied to the $\overline{CS/PRG}$ of EPROM 17 as a program pulse, until outputs QA, QB, QC and QD are changed to 1,1,1,1 and an output generated from the gate 40 resets the flip-flop 51. The duration of the program pulse is 50 ms.

When the power switch 13 is turned on, entire circuit is reset by a differentiation pulse from an initial reset circuit 43.

Thus;

A. A "1" is applied to a reset R of a binary counter 46 through an inverter 44 and 2-input NAND gate 45 to clear it.

B. A first flip-flop 48 is reset through a 2-input NAND gate 47. An output "0" from a 2-input NAND gate 49 resets the second frequency divider 39 to fix entire outputs QA, QB, QC and QD to "0". Thus, the output of 4-input NAND gate 40 is fixed to "1" during the period of reset of the second frequency divider 39.

C. A second flip-flop (hereinafter called F.F) 51 is reset through a 2-input NAND gate 50. A "0" is applied to the $\overline{CS/PRG}$ of the EPROM 17 through the inverter 52 and the EPROM 17 is set to the data output state.

D. A third F.F 53 is reset and an output Q of "1" is applied to a 3-input NAND gate 54 and a 2-input NAND gate 55 to close them.

E. A ring counter 58 is reset through an inverter 56 and a 3-input NOR gate 57. The output Q0 goes to a "1" and outputs Q1, Q2, Q3 and Q4 go to "0". Each time a one-cycle-end signal "0" is applied to the clock terminal C of the ring counter, the output signal "1" is sequentially shifted as Q0→Q1→Q2→Q3→Q4, as hereinafter described. The Q0 corresponds to the erase check mode (E), Q1 to write (W), Q2 to program (P), Q3 to verify check (V) and Q4 to reset (R), respectively, Here, the erase check mode determines whether an EPROM to be used is normal.

F. A fourth F.F 60 is reset through a 2-input NOR gate 59 to keep the abnormality indicating lamp 22 off.

G. A fifth F.F 62 is reset through an inverter 61 to light the indicating lamp 21.

Then, the EPROM 17 is engaged with the connector 19 and the erase check switch 20 is depressed. An output of a 2-input AND gate 63 goes to "0" which is applied to the $\overline{OE}$ of the EPROM 17, setting the EPROM to data output state. The output of a 2-input NOR gate 64 goes to "1", whereby the third F.F 53 is set through a one-shot pulse generating circuit 65 including a delay circuit to open the 3-input NAND gate 54 and 2-input NAND gate 55.

The first frequency divider 38 is in an output state at all times because the reset terminal R is connected to the ground. Thus, a clock pulse from the divider 38 is applied to the clock terminal C of the binary counter 46 through gates 55 and 67 to address the EPROM 17 through address lines Q0, Q1 . . . Q6 of the binary counter 46. Data outputs are produced from data lines D1, D2 . . . D8 of the EPROM 17. However, a 3-state buffer 68 is closed by the output "1" of the 2-input NOR gate 49 and a gate of a comparator 69 is closed by an output $\overline{V}$ of "1" at Q3 of the ring counter 58. Accordingly, all of data outputs D1, D2 . . . D8 are applied to an 8-input AND gate 70.

If one of the data of 100 words × 8 bit of D1, D2 . . . D8 is "0", the output of the 8-input AND gate 70 goes to "0" which is applied to a 3-input NAND gate 71. Since the output $\overline{E}$ of "0" at Q0 of the ring counter 58 is previously applied to the gate 71, by negative going of a timing pulse TP (a differentiation pulse in synchronism with a clock pulse), all of three inputs go to "0" which causes the gate 71 to produce "1". The F.F 60 is set through a 2-input OR gate 72 to light the abnormality indicating lamp 22. The output of the 3-input NOR gate 57 which is operated through the 2-input OR gate 72 and an inverter 73 resets the ring counter 58, and reset the F.F 62 through the inverter 61. Thus, the finish indicating lamp 21 is lighted. The EPROM is then replaced.

If the EPROM is normal, the output of the 8-input AND gate 70 is at "1". The abnormality indicating lamp 22 and finish indicating lamp 21 are not lighted and the ring counter 58 is not reset.

When binary counter 58 counts one hundred clock pulses, the 3-input NAND gate 74 produces a one cycle end signal "0". The output "1" of the ring counter 58 is shifted from Q0 to Q1 so that the system is changed to the write mode. Further, by the one cycle end signal "0", the binary counter 46 is cleared through the 2-input NOR gate 45, and the third F.F 53 is reset through the 2-input NOR gate 47. Thus, the 3-input NAND gate 54 and 2-input NAND gate 55 are closed to stop the timing pulse TP. The output of the 2-input NAND gate 55 is fixed to "1".

Then, the program sheet 1 is inserted into the device up to the indication 8. The output of the photoelectric switch unit R/W becomes "0", so that the gate of a differentiation pulse generating circuit 75 is opened. Then, the program sheet is immediately taken out from the opposite side of the device. Clock pulses are inputted in the clock terminal C of the binary counter 46 through a gate 67 to address the corresponding address cells of the RAM 76 through address lines Q0, Q1, ... Q6. On the other hand, the output of the gate 67 is applied to an input R/W of the RAM 76 through the differentiation pulse generating circuit 75 in synchronism with the clock pulse. By the R/W signal, eight steps of data (FIG. 2) from photoelectric switch units are written in address cells which are addressed by the binary counter 46.

By the one cycle end signal "0" of the write mode, the output "1" of ring counter 58 is shifted to the Q2(P) so that the system is changed to the program mode. When the program sheet has passed the sheet reader 23, the output of the switch unit R/W goes to "1" which is applied to the 2-input NOR gate 49.

Thus, a. The output $\overline{P}$ of "0" at Q2 of the ring counter sets the first F.F 48 through a one-shot pulse generating circuit 77 and an inverter 78, and "1" is applied to the gate 49. Accordingly, two inputs of the gate 49 are at "1" and a "0" from the gate 49 is applied to the terminal R of the second frequency divider 39, so that divider outputs QA, QB, QC and QD generates clock pulses.

b. Each time the output QA produces eight clock pulses, the 4-input NAND gate 40 produces one read clock pulse. When divider outputs QA, QB, QC and QD are 1,0,0,0, the gate 41 produces an output for setting a F.F 51. The output Q of the F.F 51 is applied to the $\overline{CS}$/PRG of EPROM 17 as a program pulse, until outputs QA, QB, QC and QD are changed to 1,1,1,1 and an output generated from the gate 40 resets the F.F. 51. The duration of the program pulse is 50 ms.

c. The gate of 3-state buffer 68 is opened by the output "0" from the gate 49.

d. The gate of the differentiation pulse generating circuit 75 is closed by the output "1" from the switch unit R/W. The terminal R/W of the RAM 76 is fixed to a "0" to stop the input of data so that the RAM is changed to a data output state.

e. The output $\overline{P}$ of "0" at Q2(P) of the ring counter 58 is applied to the DC/DC converter and +25 volt is applied to the $V_{pp}$ terminal of the EPROM.

The read clock pulses are inputted in the binary counter 46 through the gate 67, so that address cells in the RAM 76 and EPROM 17 corresponding to address lines Q0, Q1 ... Q6 are addressed. Data having been previously written in the RAM 76 are written in address cells in the EPROM 17 in synchronism with the program pulse.

By the one cycle end signal "0" of the program mode, the output "1" of the ring counter 58 is shifted to the Q3(V), and the system is changed to the verify check mode.

a. The first F.F 48 is reset through the gate 47 and the second frequency divider 39 is reset through the gate 49 so that the divider output is stopped and the output of the 4-input NAND gate 40 is fixed to "1".

b. The output $\overline{V}$ of "0" at the Q3 of the ring counter is applied to the gate 64 and the third F.F 53 is set to open the 3-input NAND gate 54 and 2-input NAND gate 55.

c. The output "1" from the gate 49 closes the gate of of the 3-state buffer 68 and the output $\overline{V}$ of "0" at the Q3 of the ring counter is applied to the comparator 69 to open it.

The clock pulses from the first frequency divider 38 are applied to the binary counter 46 through gates 55 and 67 to address the addresses of the RAM 76 and the EPROM 17 corresponding to address lines Q0, Q1 ... Q6 thereof. The data written in the RAM is compared with the data programmed in the EPROM at the comparator 69. When the data are different, a "0" is applied to the 3-input NAND gate 77. Since the output $\overline{V}$ of "0" at the Q3 of the ring counter 58 is previously applied to the gate 77, all of the three inputs are at "0" on negative going of the timing pulse TP. Thus, the gate 77 produces a "1" and the abnormality indicating lamp 22 is lighted by the output of fourth F.F 60.

On the other hand, the output "1" of the 2-input OR gate 72 is applied to the 3-input NOR gate 57 through the inverter 73 to reset the ring counter 58 and to reset the F.F 62 through the inverter 61 so that the finish indicating lamp 21 is lighted. Accordingly, the EPROM is replaced and the operation from the erase check mode is repeated.

If the program of the EPROM is normal, the output of the comparator 69 is at "1" so that the output of the 3-input NAND gate 77 goes to "0". Thus, the abnormality indicating lamp 22 is not lighted. By the next one cycle end signal "0", the output "1" of the ring counter 58 is shifted to Q4. Thus, the ring counter 58 is self-reset through the inverter 79 and the 3-input NOR gate 57 to return to the initial erase check mode. At the same time, the fifth F.F 62 is reset to light the finish indicating lamp 21 which indicates the completion of the program. Then the EPROM is removed from the device.

The programmed EPROM is then set in a read-only sequence controller, whereby various machines may be controlled.

Although the present invention is described with respect to a system for the EPROM, the invention can be applied to other memories such as EEPROM.

While the invention has been described in conjunction with preferred specific embodiments thereof, it will be understood that this description is intended to illustrate and not limit the scope of the invention, which is defined by the following claims.

What is claimed is:

1. In an EPROM programmer having
   a sheet reading device defining a path along which a program sheet passes, the program sheet bearing write clock marks, an R/W line for controlling reading and writing functions, and data lines, the sheet reading device being arranged to generate write clock pulses, an R/W signal, and data output corresponding to the respective marks and lines on the program sheet,
   a RAM for memorizing said data output in synchronism with said write clock pulses,
   an EPROM detachably mounted on a connector,
   first means for generating read clock pulses, a binary counter for counting said clock pulses and for addressing said RAM and EPROM, a first gate means responsive to a first mode of said R/W signal to render said RAM in a write state and responsive to a second mode of said R/W signal to change said RAM to a read state for writing the data stored in the RAM into the EPROM, a second gate means for generating and end signal for stopping the reading operation when the count of said binary counter reaches a predetermined number, the improvement comprising:

a ring counter responsive to the end signal from the second gate means for sequentially producing an erase check mode signal for checking the initialized state of the EPROM, a write mode signal for writing the data into the RAM, a program mode signal for programming the EPROM, and a verify check mode signal for verifying the data programmed into the EPROM;

a third gate means responsive to the erase check mode signal for addressing the EPROM;

second means for checking the outputs of the EPROM in response to the addressing by said third gate means for determining whether the EPROM is normal and for indicating when the EPROM is abnormal, and for resetting the ring counter upon such indication; and comparing means responsive to the verify check mode signal for comparing the data in the EPROM with the data in the RAM and for indicating when the former data do not coincide with the latter, and for resetting the ring counter upon such indication.

2. The EPROM programmer according to claim 1, wherein the third gate means includes an erase check switch for transmitting the erase check mode signal and gates responive to said erase check mode signal for applying the clock pulses to the binary counter so as to address the EPROM to produce data outputs.

3. The EPROM programmer according to claim 2 wherein the second means includes a gate for transmitting abnormal data outputs from the EPROM and a lamp responsive to an output of the gate for indicating the abnormality.

* * * * *